(12) United States Patent
Lee et al.

(10) Patent No.: US 9,019,750 B2
(45) Date of Patent: Apr. 28, 2015

(54) DYNAMIC RANDOM ACCESS MEMORY APPARATUS

(71) Applicants: Wen-Ming Lee, Miaoli County (TW); Chuan-Jen Chang, Hsinchu County (TW)

(72) Inventors: Wen-Ming Lee, Miaoli County (TW); Chuan-Jen Chang, Hsinchu County (TW)

(73) Assignee: Nanya Technology Corporation, Taoyuan (TW)

( * ) Notice: Subject to any disclaimer, the term of this patent is extended or adjusted under 35 U.S.C. 154(b) by 298 days.

(21) Appl. No.: 13/684,583

(22) Filed: Nov. 26, 2012

(65) Prior Publication Data
US 2014/0146597 A1    May 29, 2014

(51) Int. Cl.
G11C 11/24      (2006.01)
G11C 5/06       (2006.01)
G11C 11/4097    (2006.01)

(52) U.S. Cl.
CPC ............... *G11C 11/24* (2013.01); *G11C 5/063* (2013.01); *G11C 11/4097* (2013.01)

(58) Field of Classification Search
CPC ..... G11C 11/24; G11C 5/063; G11C 11/4097
USPC .......................... 365/149, 51, 63, 72
See application file for complete search history.

(56) References Cited

U.S. PATENT DOCUMENTS

| | | | |
|---|---|---|---|
| 2011/0109382 A1* | 5/2011 | Jin et al. | 327/565 |
| 2012/0020142 A1* | 1/2012 | Yu et al. | 365/148 |
| 2012/0091587 A1* | 4/2012 | Or-Bach et al. | 257/741 |
| 2013/0070540 A1* | 3/2013 | Pyeon | 365/189.07 |

OTHER PUBLICATIONS

Li Jiang, et al., "Modeling TSV Open Defects in 3D-Stacked DRAM," 2010 IEEE International Test Conference (ITC), Nov. 2-4, 2010, pp. 1-9.
"Office Action of Taiwan Counterpart Application", issued on Nov. 20, 2014, p. 1-p. 5, in which the listed reference was cited.

* cited by examiner

*Primary Examiner* — J. H. Hur
(74) *Attorney, Agent, or Firm* — Jianq Chyun IP Office

(57) ABSTRACT

The present invention provides a dynamic random access memory apparatus includes a first chip and a second chip. The first chip includes a plurality of memory cells and a plurality of through-silicon vias (TSVs). The plurality of memory cells are arranged in an array. First terminals of the TSVs are respectively coupled to the memory cells. The first chip and the second chip are overlapped, the second chip includes a plurality storage capacitors. Second terminals of the TSVs are respectively coupled to the storage capacitors storage capacitors.

8 Claims, 4 Drawing Sheets

DYNAMIC RANDOM ACCESS MEMORY APPARATUS

BACKGROUND OF THE INVENTION

1. Field of Invention

The present invention generally relates to dynamic random access memory (DRAM) apparatus, and more particularly to DRAM apparatus constructed by multi-layer chips.

2. Description of Prior Art

Along with the rapid development of science and technology at the present, semiconductor memories are widely used in electrical apparatus. For storing a great quantity of data, dynamic random access memory (DRAM) (such as synchronous dynamic random access memory (SDRAM)) is a most popular solution.

In a memory cell of a DRAM, to avoid a charge loss rapidly in a storage capacitor of the memory cell during a time period is a big issue when a minimum size of the semiconductor process is reduced. Please notice here, when the minimum size of the semiconductor process is reduced, the chip size of the DRAM is reduced, too. It can be realized that, area of the storage capacitor of the memory cell must be reduced, a capacitance provided by the storage capacitor is reduced, and a charge amount of the storage capacitor is reduced correspondingly. That is, the reliability of the memory cell is reduced. On the other hand, a charge loss of the storage capacitor may be increased caused by a high temperature processing for the size of the storage capacitor is reduced, and the reliability of the memory cell is reduced accordingly, too.

SUMMARY OF THE INVENTION

The present invention provides a plurality of dynamic random access memory (DRAM) apparatuses, and more particularly to the DRAM with a 3-dimension IC structure.

The present invention provides a dynamic random access memory apparatus includes a first chip and a second chip. The first chip includes a plurality of memory cells and a plurality of through-silicon vias (TSVs). The plurality of memory cells are arranged in an array. First terminals of the TSVs are respectively coupled to the memory cells. The first chip and the second chip are overlapped, the second chip includes a plurality storage capacitors. Second terminals of the TSVs are respectively coupled to the storage capacitors storage capacitors.

In embodiment of the invention, each of the memory cells includes a transistor. a transistor having a first terminal, a second terminal and a control terminal, the first terminal of the transistor is coupled to one of a plurality of bit lines, the second terminal of the transistor is coupled to the second terminal of the corresponding TSV, the control terminal of the transistor is coupled to one of a plurality of word lines.

In embodiment of the invention, the DRAM apparatus further includes an input output controller. The input output controller coupled to the memory cells.

The present invention provides another dynamic random access memory apparatus includes a first chip and a second chip. The first chip includes a plurality of memory cells. The first chip and the second chip are overlapped, and the second chip includes a plurality of through-silicon vias (TSVs) and a plurality storage capacitors. The memory cells are arranged in an array. First terminals of the TSVs are respectively coupled to the memory cells and second terminals of the TSVs are respectively coupled to the storage capacitors.

The present invention further provides the other dynamic random access memory apparatus includes a first chip, a second chip and a third chip. The first chip includes a plurality of memory cells, and the memory cells are arranged in an array. The first chip and the second chip are overlapped. The second chip includes a plurality of through-silicon vias (TSVs). First terminals of the TSVs are respectively coupled to the memory cells. The second chip and the third chip are overlapped, and the third chip includes a plurality storage capacitors. Second terminals of the TSVs are respectively coupled to the storage capacitors.

Accordingly, the present invention provides the DRAM apparatus is constructed by a plurality of chips. The storage capacitors are independently disposed in one of the chips, and the memory cells are disposed in another one of the chips. Besides, the memory cells and the storage capacitors are connected through through-silicon vias. That is, area of the storage capacitors is not limited, and the efficiency of the DRAM apparatus is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
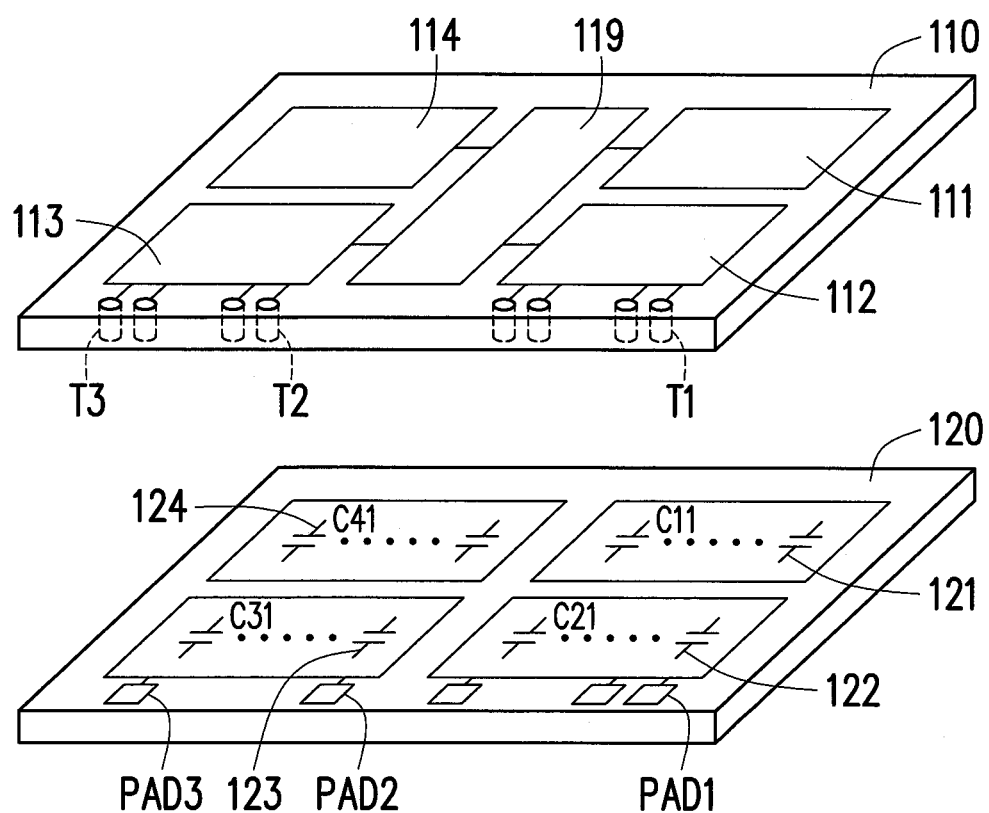
FIG. 1 illustrates a DRAM apparatus 100 according to an embodiment of the present invention.

Reference will now be made in detail to the present preferred embodiment of the invention, examples of which are illustrated in the accompanying drawings. Wherever possible, the same reference numbers are used in the drawings and the description to refer to the same or like parts.

Referring to FIG. 1, FIG. 1 illustrates a DRAM apparatus 100 according to an embodiment of the present invention. The DRAM apparatus 100 includes a first chip 110 and a second chip 120. The first chip 110 includes memory cell arrays 111-114, an input output controller 119 and through-silicon vias (TSVs) T1-T3. Each of the memory cell arrays 111-114 includes a plurality of memory cells. The input output controller 119 is coupled to the memory cell arrays 111-114 for accessing the memory cells in the memory cell arrays 111-114. The memory cells in the memory cell arrays 111-114 are coupled to the first terminals of the TSVs T1-T3.

The second chip 120 includes a plurality of storage capacitor area 121-124. Each of the storage capacitor area 121-124 includes a plurality of storage capacitors. In this embodiment, an active face of the first chip 110 backs to the second chip 120, and an active face of the second chip 120 faces to a back of the first chip 110. The storage capacitors C11-C41 in the storage capacitor area 121-124 may coupled to a plurality of pads PAD1-PAD3, and the storage capacitors C11-C41 in the storage capacitor area 121-124 may coupled to second terminals of the TSVs T1-T3 in the first chip 110 through the pads PAD1-PAD3, respectively.

By overlapping the first chip 110 and the second chip 120 into a three dimensional chip, the storage capacitors and the memory cells can be connected. Since the storage capacitors C11-C41 are independently disposed in the second chip 120, the sizes of the storage capacitors C11-C41 are not limited, and the storage capacitors C11-C41 can use to store sufficient charge.

Figure 2:
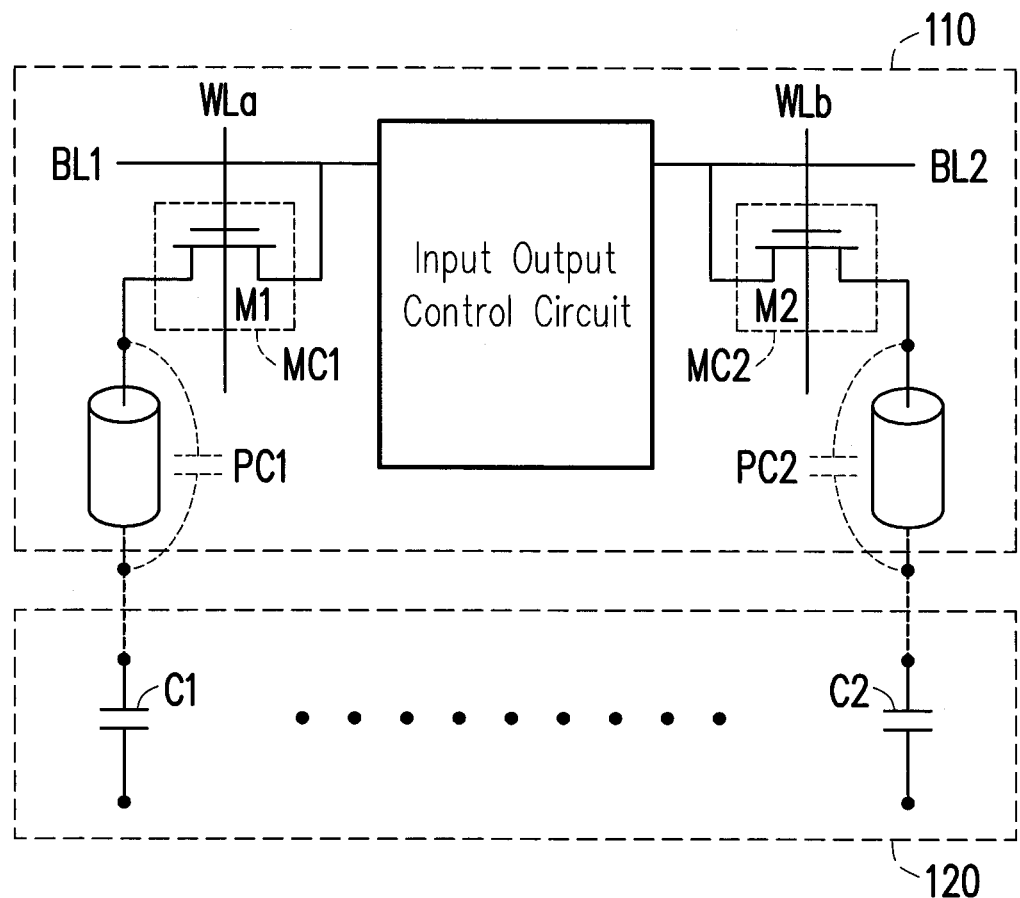
FIG. 2 illustrates a circuit diagram of the DRAM apparatus 100 according to an embodiment of the present invention.

Referring to FIG. 2, FIG. 2 illustrates a circuit diagram of the DRAM apparatus 100 according to an embodiment of the present invention. In FIG. 2, the first chip 110 includes memory cells MC1 and MC2, the input output control circuit 119 and TSVs T1 and T2. The memory cell MC1 includes a first terminal, a second terminal and a control terminal. The first terminal of the transistor M1 is coupled to a bit line BL1, and the second terminal of the transistor M1 is coupled to the first terminal of the TSV T1, and the control terminal of the transistor M1 is coupled to a word line WLa. Wherein, the bit line BL1 is one of a plurality of bit lines in the first chip 110, and the word line WLa is one of a plurality of word lines in the first chip 110. The first terminal of the transistor M2 is coupled to a bit line BL2, and the second terminal of the transistor M2 is coupled to the first terminal of the TSV T2, and the control terminal of the transistor M2 is coupled to a word line WLb. Wherein, the bit line BL2 is one of a plurality of bit lines in the first chip 110, and the word line WLb is one of a plurality of word lines in the first chip 110.

Please notice here, the TSVs T1 and T2 can also provide parasitical capacitances PC1 and PC2 to the memory cells MC1 and MC2, respectively.

The input output control circuit 119 may be a sense amplifier. The sense amplifier is used for receiving data from two of bit lines for sensing out an accessing data according to the voltage difference between voltages of two of the bit lines.

The second chip 120 includes a plurality of storage capacitors C1-C2. One terminal of the storage capacitor C1 is coupled to a second terminal of the TSV T1, and one terminal of the storage capacitor C2 is coupled to a second terminal of the TSV T2. The terminals of the storage capacitors C1 and C2 may be coupled to a reference ground voltage.

Figure 3:
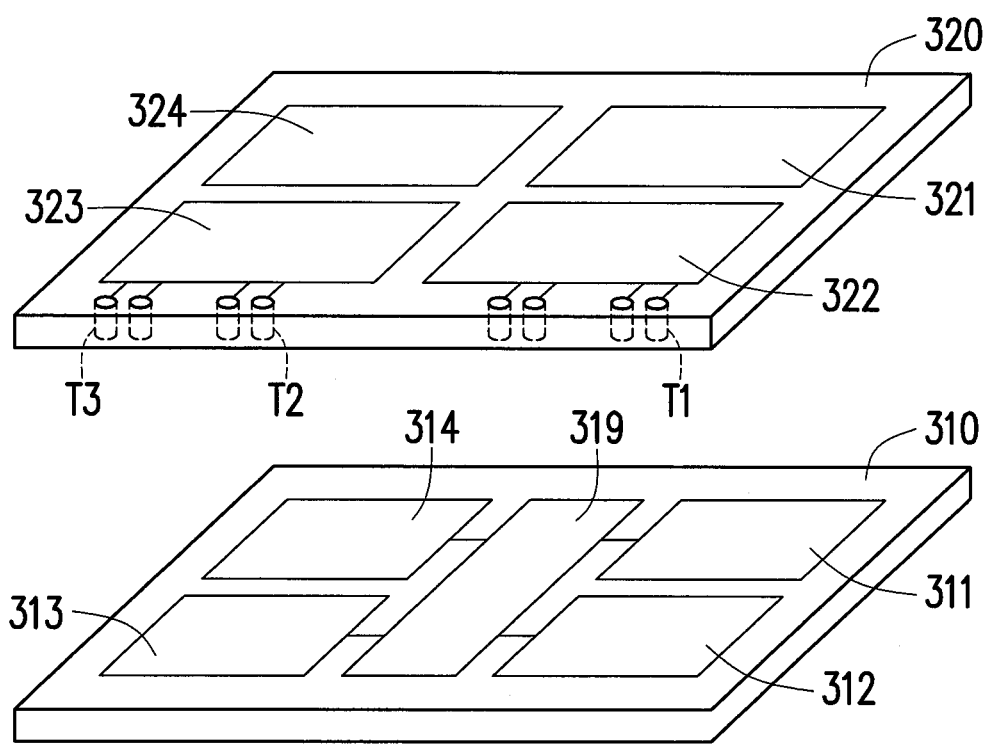
FIG. 3 illustrates a DRAM apparatus 300 according to an embodiment of the present invention.

Referring to FIG. 3, FIG. 3 illustrates a DRAM apparatus 300 according to an embodiment of the present invention. The DRAM apparatus 300 includes the first chip 310 and a second chip 320. The first chip 310 includes memory cell arrays 311-314 and an input output controller 319. Each of the memory cell arrays 311-314 includes a plurality of memory cells. The input output controller 319 is coupled to the memory cell arrays 311-314 for accessing the memory cells in the memory cell arrays 311-314. The second chip 320 includes a plurality of storage capacitor area 321-324 and a plurality of the TSVs T1-T3. Each of the storage capacitor area 321-324 includes a plurality of storage capacitors. First terminal of the storage capacitors are respectively coupled to the first terminals of the TSVs T1-T3. By overlapping the first chip 110 and the second chip 120 into a three dimensional chip, the memory cells are respectively coupled to the second terminals of the TSVs T1-T3. In another word, the memory cells are respectively coupled to the storage capacitors through the TSVs T1-T3.

Please notice here, in this embodiment, the active face of the first chip 310 faces to the back of the second chip 320. That is, the active face of the second chip 320 backs to the first chip 310.

Figure 4:
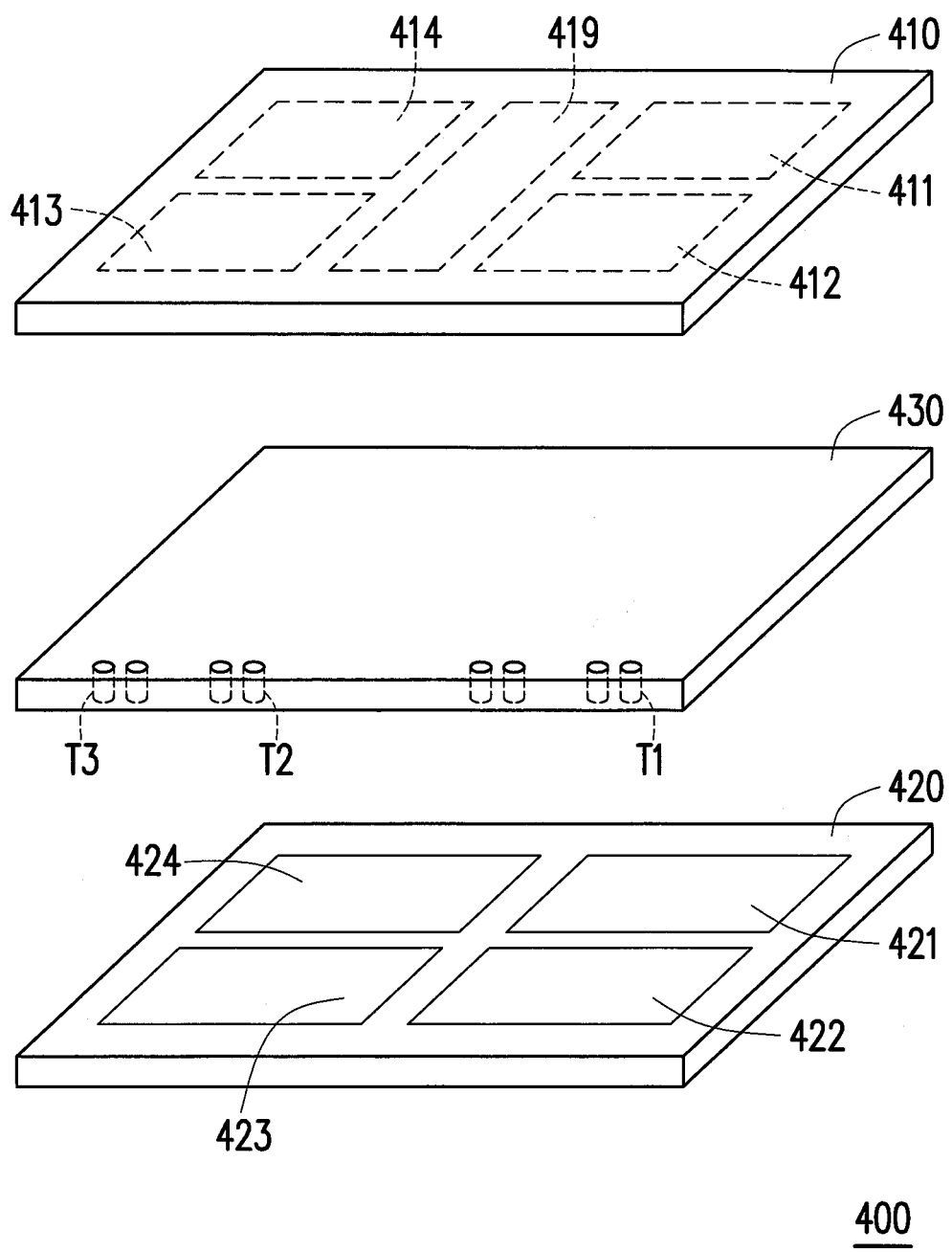
FIG. 4 illustrates a DRAM apparatus 400 according to an embodiment of the present invention.

Referring to FIG. 4, FIG. 4 illustrates a DRAM apparatus 400 according to an embodiment of the present invention. The DRAM apparatus 400 includes the first chip 410, a second chip 420 and a third chip 430. The first chip 410 includes memory cell arrays 411-414 and an input output controller 419. Each of the memory cell arrays 411-414 includes a plurality of memory cells. The second chip 430 includes a plurality of the TSVs T1-T3. By overlapping the first chip 410 and the second chip 420, the first terminals of the TSVs T1-T3 are coupled to the memory cells in the first chip 410.

On the other hand, the third chip 420 includes a plurality of storage capacitor areas 421-424. Each of the storage capacitor areas 421-424 includes a plurality of storage capacitors. By overlapping the first, second and third chips 410-430, the storage capacitors are respectively coupled to the second terminals of the TSVs T1-T3, and the storage capacitors are coupled to the memory cells in the first chip 410 through the TSVs T1-T3, respectively.

Please notice here, the active face of the first chip 410 faces to one face of the second chip 430, and the active face of the third chip 420 face to the other face of the second chip 430.

According to the above descriptions, in the invention, the storage capacitors are disposed in a single chip, and there is no memory cell disposed in the chip which is used to dispose the storage capacitors. That is, the sizes of the storage capacitors are not limited, and designer may layout the storage capacitors with sufficient areas. The efficiency of the DRAM apparatus can be preserved.

In order to make the aforementioned and other features and advantages of the invention comprehensible, several exemplary embodiments accompanied with figures are described in detail below.

What is claimed is:

1. A dynamic random access memory (DRAM) apparatus, comprising:
   a first chip, comprising:
      a plurality of memory cells, the memory cells are arranged in an array; and
      a plurality of through-silicon vias (TSVs), first terminals of the TSVs respectively being coupled to the memory cells; and
   a second chip, the first chip and the second chip are overlapped, the second chip comprising:
      a plurality storage capacitors, second terminals of the TSVs respectively being coupled to the storage capacitors,
   wherein, each of the memory cells comprises:
      a transistor, having a first terminal, a second terminal and a control terminal, the first terminal of the transistor is coupled to one of a plurality of lines, the second terminal of the transistor is coupled to the second terminal of the corresponding TSV, the control terminal of the transistor is coupled to one of a plurality of words lines.

2. The DRAM apparatus according to claim 1, further comprising:
   an input output controller, coupled to the memory cells.

3. A dynamic random access memory (DRAM) apparatus, comprising:
   a first chip, comprising:
      a plurality of memory cells, the memory cells are arranged in an array; and
   a second chip, the first chip and the second chip are overlapped, the second chip comprising:
      a plurality of through-silicon vias (TSVs), first terminals of the TSVs respectively being coupled to the memory cells; and
      a plurality storage capacitors, second terminals of the TSVs respectively being coupled to the storage capacitors,
   wherein, each of the memory cells comprises:

a transistor, having a first terminal, a second terminal and a control terminal, the first terminal of the transistor is coupled to one of a plurality of lines, the second terminal of the transistor is coupled to the second terminal of the corresponding TSV, the control terminal of the transistor is coupled to one of a plurality of words lines.

4. The DRAM apparatus according to claim 3, further comprising:

an input output controller, coupled to the memory cells.

5. The DRAM apparatus according to claim 3, wherein a non-active face of the second chip faces the first chip.

6. A dynamic random access memory (DRAM) apparatus, comprising:

a first chip, comprising:
a plurality of memory cells, the memory cells are arranged in an array;
a second chip, the first chip and the second chip are overlapped, the second chip comprising:
a plurality of through-silicon vias (TSVs), first terminals of the TSVs respectively being coupled to the memory cells; and a third chip, the second chip and the third chip are overlapped, the third chip comprising:
a plurality storage capacitors, second terminals of the TSVs respectively being coupled to the storage capacitors, wherein, each of the memory cells comprises:
a transistor, having a first terminal, a second terminal and a control terminal, the first terminal of the transistor is coupled to one of a plurality of lines, the second terminal of the transistor is coupled to the second terminal of the corresponding TSV, the control terminal of the transistor is coupled to one of a plurality of words lines.

7. The DRAM apparatus according to claim 6, further comprising:

an input output controller, coupled to the memory cells.

8. The DRAM apparatus according to claim 6, wherein an active face of the first chip faces the second chip.

* * * * *